(12) United States Patent
Kim et al.

(10) Patent No.: US 12,057,530 B2
(45) Date of Patent: Aug. 6, 2024

(54) LIGHT EMITTING DEVICE

(71) Applicant: Seoul Semiconductor Co., Ltd., Ansan-si (KR)

(72) Inventors: Hyuck Jun Kim, Ansan-si (KR); Chung Hoon Lee, Ansan-si (KR); Y O Cho, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 17/883,505

(22) Filed: Aug. 8, 2022

(65) Prior Publication Data

US 2022/0384692 A1    Dec. 1, 2022

Related U.S. Application Data

(63) Continuation of application No. 16/847,442, filed on Apr. 13, 2020, now Pat. No. 11,417,807, which is a
(Continued)

(51) Int. Cl.
*H01L 33/50* (2010.01)
*H01L 25/075* (2006.01)
(Continued)

(52) U.S. Cl.
CPC ........ *H01L 33/502* (2013.01); *H01L 25/0753* (2013.01); *H01L 33/382* (2013.01); *H01L 33/504* (2013.01); *H01L 33/62* (2013.01)

(58) Field of Classification Search
CPC . H01L 33/502; H01L 25/0753; H01L 33/382; H01L 33/504; H01L 33/62;
(Continued)

(56) References Cited

U.S. PATENT DOCUMENTS 7,744,242 B2 * 6/2010 Kramer .................. H05B 45/22
                                                362/228
8,071,988 B2 * 12/2011 Lee ..................... H01L 25/0753
                                                 257/89
(Continued)

FOREIGN PATENT DOCUMENTS

EP        2453489        5/2012
EP    2 701 213 A1    2/2014
(Continued)

OTHER PUBLICATIONS

Chinse Office Action dated Feb. 18, 2023, in Chinse Patent Application No. 201880005663.9. (with Concise English Explanation).
(Continued)

*Primary Examiner* — Mohammed Shamsuzzaman
(74) *Attorney, Agent, or Firm* — Oblon, McClelland, Maier & Neustadt, L.L.P.

(57) ABSTRACT

A light emitting device including at least one main light emitting unit including a light emitting diode chip and a wavelength converter, and configured to emit white light, in which the light emitting diode chip includes at least one of an ultraviolet chip, a violet chip, and a blue chip, and the light emitting device is configured to be adjustable to emit light corresponding to a spectral power distribution of morning sunlight, light corresponding to a spectral power distribution of afternoon sunlight, and light corresponding to a spectral power distribution of evening sunlight.

20 Claims, 8 Drawing Sheets

Related U.S. Application Data continuation of application No. 16/018,560, filed on Jun. 26, 2018, now Pat. No. 10,622,525.

(60) Provisional application No. 62/576,968, filed on Oct. 25, 2017, provisional application No. 62/577,032, filed on Oct. 25, 2017, provisional application No. 62/525,541, filed on Jun. 27, 2017.

(51) Int. Cl.
*H01L 33/38* (2010.01)
*H01L 33/62* (2010.01)

(58) Field of Classification Search
CPC ...... H01L 33/38; F21S 10/00; F21Y 2105/18; F21Y 2113/17; F21Y 2115/10
See application file for complete search history.

(56) References Cited

U.S. PATENT DOCUMENTS

| | | | | |
|---|---|---|---|---|
| 8,269,410 | B2* | 9/2012 | Kijima | C09K 11/77742 |
| | | | | 313/485 |
| 8,659,043 | B1* | 2/2014 | Tischler | H01L 24/97 |
| | | | | 257/98 |
| 8,686,625 | B1* | 4/2014 | Ashdown | H01L 33/60 |
| | | | | 313/484 |
| 9,335,006 | B2* | 5/2016 | Le Toquin | F21K 9/00 |
| 9,897,298 | B2* | 2/2018 | Shin | H01L 25/00 |
| 11,083,059 | B2* | 8/2021 | Francis | H01L 27/156 |
| 11,164,999 | B2* | 11/2021 | Xu | H01L 33/504 |
| 2002/0048177 | A1 | 4/2002 | Rahm et al. | |
| 2006/0126326 | A1* | 6/2006 | Ng | H04N 23/56 |
| | | | | 348/E5.029 |
| 2007/0138978 | A1* | 6/2007 | Rains, Jr. | G09F 13/22 |
| | | | | 315/291 |
| 2010/0103678 | A1* | 4/2010 | Van De Ven | F21K 9/68 |
| | | | | 362/373 |
| 2011/0050126 | A1* | 3/2011 | Wang | F21V 5/10 |
| | | | | 315/294 |
| 2011/0096560 | A1* | 4/2011 | Ryu | C09K 11/0883 |
| | | | | 252/301.4 R |
| 2011/0286210 | A1* | 11/2011 | Shiue | F21K 9/00 |
| | | | | 362/231 |
| 2012/0080713 | A1* | 4/2012 | Agatani | H05K 1/11 |
| | | | | 257/E33.066 |
| 2012/0098460 | A1* | 4/2012 | Miyasaka | H05B 45/395 |
| | | | | 315/294 |
| 2012/0267999 | A1* | 10/2012 | Sakuta | C09K 11/7739 |
| | | | | 313/503 |
| 2012/0307488 | A1* | 12/2012 | Preuschl | H05K 1/029 |
| | | | | 362/382 |
| 2013/0141013 | A1* | 6/2013 | Kodama | F21V 13/08 |
| | | | | 315/294 |
| 2013/0154519 | A1* | 6/2013 | Riesebosch | H01L 25/0753 |
| | | | | 257/91 |
| 2013/0235555 | A1* | 9/2013 | Tanaka | F21V 3/12 |
| | | | | 362/84 |
| 2013/0278137 | A1* | 10/2013 | Maxik | F21V 9/20 |
| | | | | 315/51 |
| 2015/0023011 | A1* | 1/2015 | Takei | F21V 23/0464 |
| | | | | 362/231 |
| 2015/0062892 | A1 | 3/2015 | Krames et al. | |
| 2015/0069432 | A1* | 3/2015 | Chiu | H01L 25/0753 |
| | | | | 257/89 |
| 2016/0091172 | A1* | 3/2016 | Wu | H01L 25/0753 |
| | | | | 362/293 |
| 2016/0116141 | A1* | 4/2016 | Tseng | F21V 17/10 |
| | | | | 362/249.14 |
| 2016/0284949 | A1* | 9/2016 | Hagelaar | F21K 9/62 |
| 2016/0286616 | A1* | 9/2016 | van de Ven | H05B 45/37 |
| 2017/0238390 | A1* | 8/2017 | Yamakawa | F21S 2/00 |
| | | | | 315/294 |
| 2017/0261164 | A1* | 9/2017 | Ogata | H05B 45/00 |
| 2017/0268734 | A1 | 9/2017 | Kawaguchi et al. | |
| 2018/0054974 | A1 | 3/2018 | Vasilenko | |
| 2018/0135813 | A1* | 5/2018 | Yamakawa | H01L 33/00 |
| 2018/0139817 | A1* | 5/2018 | Yamakawa | H01L 33/50 |
| 2018/0231191 | A1* | 8/2018 | Shchekin | F21K 9/64 |
| 2022/0026052 | A1* | 1/2022 | Keller | G02B 6/0095 |

FOREIGN PATENT DOCUMENTS

| | | |
|---|---|---|
| JP | 5056520 | 10/2012 |
| JP | 2015-185367 | 10/2015 |
| KR | 10-2013-0065915 | 6/2013 |
| KR | 10-2016-0120910 | 10/2016 |
| KR | 20160120910 A | 10/2016 |
| WO | 2016/084437 | 6/2016 |
| WO | 2016-154570 | 9/2016 |
| WO | 2016154570 A1 | 9/2016 |

OTHER PUBLICATIONS

Chinse Office Action dated Jan. 31, 2023, in Chinse Patent Application No. 201910991233.5. (with Concise English Explanation).
European Office Action dated Dec. 14, 2022, in European Patent Application No. 18825551.7.
Non-Final Office Action dated in Jul. 5, 2019 issued in U.S. Appl. No. 16/018,560.
Notice of Allowance dated in Dec. 11, 2019, issued in U.S. Appl. No. 16/018,560.
Extended European Search Report dated Dec. 16, 2020, issued in European Patent Application No. 18825551.7.
Non-Final Office Action dated in Nov. 10, 2021 issued in U.S. Appl. No. 16/018,560.
Notice of Allowance dated in Apr. 13, 2022, issued in U.S. Appl. No. 16/018,560.
Extended European Search Report issued Apr. 30, 2024 in European Patent Application No. 23213174.8, 12 pages.

* cited by examiner

LIGHT EMITTING DEVICE

CROSS-REFERENCE TO RELATED APPLICATIONS

This application is a continuation of U.S. patent application Ser. No. 16/847,442, filed on Apr. 13, 2020, which is a continuation of U.S. patent application Ser. No. 16/018,560, filed on Jun. 26, 2018, now issued as U.S. Pat. No. 10,622,525 on Apr. 14, 2020, which claims priority from and the benefit of U.S. Provisional Application No. 62/525,541, filed on Jun. 27, 2017, U.S. Provisional Application No. 62/576,968, filed on Oct. 25, 2017, and U.S. Provisional Application No. 62/577,032, filed on Oct. 25, 2017, each of which is hereby incorporated by reference for all purposes as if fully set forth herein.

BACKGROUND

Field

The present disclosure relates to a light emitting device, and more particularly, to a light emitting device which can be used in a lighting fixture using a light emitting diode as a light source.

Discussion of the Background

Most living organisms have been adapted to work in accordance with changes in sunlight. A human body has also been adapted to sunlight for a long time. As a result, the biological rhythm of a human being changes in accordance with the change of sunlight. Especially in the morning cortisol hormone is secreted in the human body under bright sunlight. Cortisol hormone allows more blood to be supplied to each organ of the body to counteract external stimuli such as stress, as a result, pulses and respiration are increased and the human body is awakened from sleep to prepare for outside activities. In the daytime, physical activities are performed under strong sunlight, but melatonin hormone is secreted in the evening and lowers pulse rate, body temperature, and blood pressure, as a result, gets a human body tired and helps to sleep.

However, in modern society, most people do not perform physical activities under sunlight, but mainly work in indoors such as homes and offices. It is normal that most people stay indoors for longer than the hours of physical activity under sunlight, even in the midday.

In the meantime, indoor lighting devices generally exhibit certain spectral power distributions, and these spectral power distributions have many differences from the spectral power distribution of sunlight. For example, in the case of a light emitting device using blue, green, and red light emitting diodes, even though white light can be implemented by a combination of blue, green, and red, the light emitting device does not exhibit a spectral power distribution over a wide wavelength range of visible range as in sunlight, but exhibit a distribution having a peak at a certain wavelength In addition, human skin produces vitamin D using ultraviolet rays of sunlight, but indoor lighting devices do not have these ultraviolet components and vitamin D is not produced even if activities are done under indoor lighting devices for a long period.

SUMMARY

Exemplary embodiments of the present disclosure provide a light emitting device to implement spectral power distribution change of sunlight which a human body is adapted to.

Other exemplary embodiments of the present disclosure provide a light emitting device capable of implementing a desired spectral power distribution with spectral power of sunlight adapted to the human body.

Other exemplary embodiments of the present disclosure provide a light emitting device illuminating indoor rooms and providing ultraviolet rays, similar to sunlight, from which human skin is capable of producing vitamin D.

Additional features of the disclosure will be described in the following detailed description, and in part will be obvious from the detailed description, or concepts of the disclosure may be acquired by practice.

A light emitting device in accordance with one exemplary embodiment comprises at least one main light emitting unit including a light emitting diode chip and a wavelength converter to emit white light, wherein the light emitting diode chip comprises an ultraviolet chip, a violet chip or a blue chip, and is adjustable to emit light corresponding to a spectral power distribution of morning sunlight, light corresponding to a spectral power distribution of afternoon sunlight, and light corresponding to a spectral power distribution of evening sunlight.

A light emitting device in accordance with another exemplary embodiment comprises a base; a first electrode, a second electrode, a third electrode and a fourth electrode formed on the base; and a first light emitting group on the base and a second light emitting group disposed adjacent to the first light emitting group, wherein each of the first light emitting group and the second light emitting group comprises a plurality of light emitting diode chips, respectively, wherein the first light emitting group and the second light emitting group emit light of different color temperature, respectively, wherein the first light emitting group is connected to the first electrode and the third electrode, and wherein the second light emitting group is connected to the second electrode and the fourth electrode.

As used herein, the term "light emitting unit" indicates an individual light emitting source capable of implementing a specific spectral power distribution within a light emitting device. In the case when a light emitting diode chip is arranged without a wavelength converter, the light emitting diode chip becomes a light emitting unit, and in the case when a wavelength converter is applied on a light emitting diode chip, the combination of the light emitting diode chip and the wavelength converter becomes a light emitting unit. In the meantime, a light emitting unit implementing white light by a combination of a light emitting diode chip and a wavelength converter is called a main light emitting unit, and a light emitting unit implementing light other than white light is called an auxiliary light emitting unit.

BRIEF DESCRIPTION OF DRAWINGS

The following drawings are included to provide a better understanding of concepts of the present invention, are included in and constitute a part of the present disclosure, illustrate exemplary embodiments of the present disclosure, and contribute to explain principles of concepts of the present invention with detailed descriptions.

DETAILED DESCRIPTION OF THE ILLUSTRATED EMBODIMENTS

Figure 1:
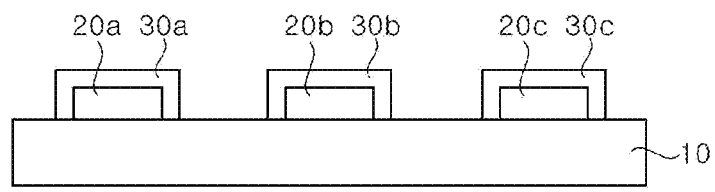
FIG. 1 is a schematic cross-sectional view for illustrating a light emitting device in accordance with an exemplary embodiment of the present disclosure.

Hereinafter, exemplary embodiments of the present disclosure will be described in detail with reference to the accompanying drawings. The following exemplary embodiments are provided by way of example so as to fully convey the spirit of the present disclosure to those skilled in the art to which the present disclosure pertains. Accordingly, the present disclosure is not limited to the embodiments disclosed herein, and can also be implemented in different forms. In addition, in the drawings, widths, lengths, thicknesses, and the like of elements may be exaggerated for clarity and descriptive purposes. Throughout the specification, like numerals denote like elements.

First, various embodiments of a light emitting device of the present disclosure for implementing light corresponding to changes in spectral power distributions of sunlight will be described with reference to FIGS. 1 to 8.

Exemplary Embodiment 1

FIG. 1 is a schematic cross-sectional view for illustrating a light emitting device in accordance with an exemplary embodiment of the present disclosure.

Referring to FIG. 1, the light emitting device may comprise a base 10, light emitting diode chips 20a, 20b, and 20c and wavelength converters 30a, 30b, and 30c.

Like a printed circuit board, the base 10 may comprise circuit wirings for supplying electric power to each of the light emitting diode chips 20a, 20b, and 20c.

Each of the light emitting diode chips 20a, 20b, and 20c may be an ultraviolet (UV) chip, a violet chip, or a blue chip. The ultraviolet chip may emit light in the wavelength range of 290 to 390 nm, but is not particularly limited thereto. In a particular example, the ultraviolet chip may emit ultraviolet light in the wavelength range of 290 to 320 nm, as a result, it may contribute to the production of vitamin D in human skins. In the meantime, the violet chip may emit light in the range of 400 to 440 nm and the blue chip may emit light in the range of 440 to 470 nm.

The light emitting diode chips 20a, 20b, and 20c may be chips having the same peak wavelength, but they are not limited thereto, and may emit light of different peak wavelengths within the above ranges.

The wavelength converters 30a, 30b, and 30c may be coated or adhered onto the chips. The wavelength converters 30a, 30b, and 30c may comprise phosphors emitting fluorescence in relatively wide wavelength ranges. One or more phosphors may be incorporated in each of the wavelength converters 30a, 30b, and 30c.

For instance, phosphors may comprise YAG phosphors, LuAG phosphors, β-sialon (SiAlON), alpha-sialon (SiAlON), CASN, Silicate BAM phosphors, or others, and at least one of these can be selected.

YAG phosphor is generally selected for yellow wavelengths, and it is possible to emit light in a wavelength range from yellowish orange to green by adding Gd and Ga. As Gd is added and its amount increases, a wavelength shifts to a longer wavelength, while as Ga is added and its amount increases, a wavelength shifts to a shorter wavelength.

LuAG-based phosphor is mainly selected for yellowish green wavelengths, and it is possible to emit Cyan color by adding Ga.

Beta sialon (SiAlON) is suitable for emitting light in a green wavelength range, and alpha sialon (SiAlON) is suitable for emitting light in an amber wavelength range. In addition, the CASN (CaAlSiN)-based phosphors are suitable for emitting light in a red wavelength range.

Light corresponding to a spectral power distribution of morning sunlight is implemented by the light emitting diode chip 20a and the wavelength converter 30a. Similarly, light corresponding to a spectral power distribution of daylight (afternoon sunlight) is implemented by the light emitting diode chip 20b and the wavelength converter 30b, and light corresponding to a spectral power distribution of evening sunlight is implemented by the light emitting diode chip 20c and the wavelength converter 30c.

In the present exemplary embodiment, a combination of the light emitting diode chip and the wavelength converter constitutes a "light emitting unit". Here, the light emitting unit represents a unit capable of implementing a particular spectral power distribution individually in a light emitting device. In the meantime, hereinafter, a light emitting unit emitting white light is called a main light emitting unit, and a light emitting unit emitting light of a color other than white light is called an auxiliary light emitting unit. Therefore, light emitting units of this exemplary embodiment are all main light emitting units.

In the present exemplary embodiment, although the light emitting units are illustrated as being mounted on a single base 10, light emitting units may be provided as light emitting modules mounted on different sub-mounts or printed circuit boards, and these light emitting modules may be mounted on the base 10.

In addition, the light emitting units may be molded together by the same molding material, or molded respectively by molding materials which are separated from each other.

Furthermore, the light emitting device may be used for various lighting devices such as light bulbs and tube lighting devices.

In the light emitting device in accordance with the present exemplary embodiment, each light emitting unit independently operates and implements light corresponding to morning sunlight, afternoon sunlight, or evening sunlight.

Exemplary Embodiment 2

Figure 2:
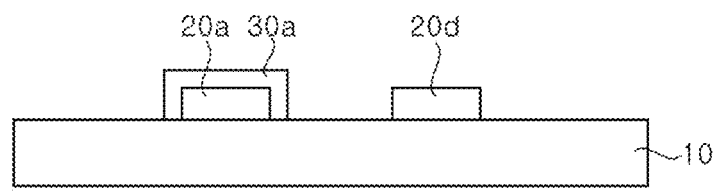
FIG. 2 is a schematic cross-sectional view for illustrating a light emitting device in accordance with another exemplary embodiment of the present disclosure.

FIG. 2 is a schematic cross-sectional view for illustrating a light emitting device in accordance with another exemplary embodiment of the present disclosure.

Referring to FIG. 2, the light emitting device in accordance with the present embodiment comprises a base 10, light emitting diode chips 20a and 20d, and a wavelength converter 30a.

The light emitting diode chip 20a, as described above, may be an ultraviolet (UV) chip, a violet chip, or a blue chip. Here, the blue chip can emit light in the range of 390 to 470 nm, in particular, it can emit light in the short wavelength range of 390 to 430 nm.

The wavelength converter 30a comprises a phosphor, and the phosphor may be selected from the phosphors described in the previous embodiment. A light emitting unit (a main light emitting unit) including the light emitting diode chip 20a and the wavelength converter 30a may implement light corresponding to a spectral power distribution of morning sunlight, afternoon sunlight or evening sunlight, respectively, but is not limited thereto.

In the meantime, the light emitting diode chip 20d is used for a light emitting unit without a wavelength converter. The light emitting diode chip 20d is an auxiliary light emitting unit, which may be selected from a violet chip, a blue chip, a cyan chip, a green chip, a yellow chip, an amber chip, or a red chip. One of the chips among them may be selected and used, or a combination of two or more chips may be selected and used.

In the present exemplary embodiment, although the light emitting units are illustrated as being mounted on the single base 10, light emitting units may be provided as light emitting modules mounted on different sub-mounts or printed circuit boards, and these light emitting modules may be mounted on the base 10.

In the present exemplary embodiment, the main light emitting unit may emit light corresponding to a spectral power distribution of morning sunlight, afternoon sunlight, or evening sunlight, and light corresponding to spectral power distributions of two different sunlight may be implemented by combining the main light emitting unit and the auxiliary light emitting unit. Alternatively, light corresponding to each of spectral power distributions of morning sunlight, afternoon sunlight, and evening sunlight may be implemented by both of the main lighting unit and the auxiliary lighting unit.

Exemplary Embodiment 3

Figure 3:
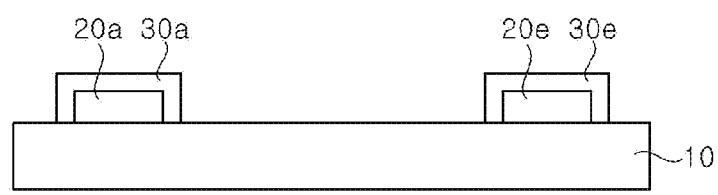
FIG. 3 is a schematic cross-sectional view for illustrating a light emitting device in accordance with another exemplary embodiment of the present disclosure.

FIG. 3 is a schematic cross-sectional view for illustrating a light emitting device in accordance with another exemplary embodiment of the present disclosure.

The light emitting device in accordance with the present embodiment, the base 10 comprises light emitting diode chips 20a and 20c and wavelength converters 30a and 30c.

Here, the light emitting diode chip 20a and the wavelength converter 30a constitute a main light emitting unit, and a light emitting diode chip 20e and a wavelength converter 30e constitute an auxiliary light emitting unit.

The light emitting diode chip 20a may be an ultraviolet chip, a violet chip or a blue chip as described in previous embodiments. The light emitting diode chip 20e is a blue chip, and the wavelength converter 30e comprises at least one phosphor selected from cyan, green, yellow, amber, or red phosphor.

In the present exemplary embodiment, it is described that one auxiliary light emitting unit is used, but a plurality of auxiliary light emitting units may be used.

In the present exemplary embodiment, the main light emitting unit may emit light corresponding to a spectral power distribution of morning sunlight, afternoon sunlight, or evening sunlight, and light corresponding to spectral power distributions of two different sunlight may be implemented by combining the main light emitting unit and the auxiliary light emitting unit. Alternatively, light corresponding to each of the spectral power distributions of morning sunlight, afternoon sunlight, and evening sunlight may be implemented by both of the main lighting unit and the auxiliary lighting unit.

Exemplary Embodiment 4

Figure 4:
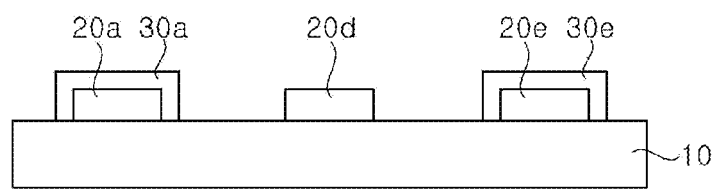
FIG. 4 is a schematic cross-sectional view for illustrating a light emitting device in accordance with another exemplary embodiment of the present disclosure.

FIG. 4 is a schematic cross-sectional view for illustrating a light emitting device in accordance with another exemplary embodiment of the present disclosure.

Referring to FIG. 4, the light emitting device in accordance with the present exemplary embodiment comprises a base 10, light emitting diode chips 20a, 20d, and 20e, and wavelength converters 30a and 30e.

Here, the light emitting diode chip 20a and the wavelength converter 30a constitute a main light emitting unit, the light emitting diode chip 20d constitutes a first auxiliary light emitting unit, and the light emitting diode chip 30e constitutes a second auxiliary light emitting unit.

The light emitting diode chip 20a may be an ultraviolet chip, a violet chip or a blue chip as described in previous embodiments. In the meantime, as described in the embodiment of FIG. 2, the light emitting diode chip 20d may be selected from a violet chip, a blue chip, a cyan chip, a green chip, a yellow chip, an amber chip, or a red chip, or any combination thereof.

The light emitting diode chip 20e is a blue chip as described in the embodiment of FIG. 3, the wavelength converter 30e is at least one selected from cyan, green, yellow, amber, or red phosphors. A single or a plurality of auxiliary light emitting units including a light emitting diode chip 20e and a wavelength converter 30e may be used for the light emitting device in the present embodiment.

In the present exemplary embodiment, the main light emitting unit may emit light corresponding to a spectral power distribution of morning sunlight, afternoon sunlight, or evening sunlight, and light corresponding to spectral power distributions of two different sunlight may be implemented by combining the main light emitting unit and the first and the second auxiliary light emitting units. Alternatively, light corresponding to each of the spectral power distributions of morning sunlight, afternoon sunlight, and evening sunlight may be implemented by combining the main light emitting unit and the first and/or the second auxiliary light emitting units.

Exemplary Embodiment 5

Figure 5:
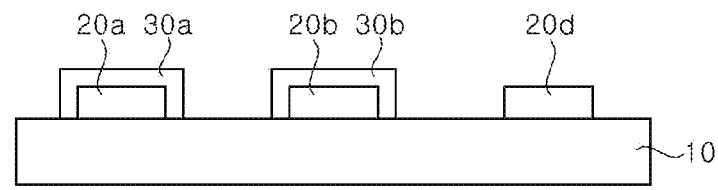
FIG. 5 is a schematic cross-sectional view for illustrating a light emitting device in accordance with another exemplary embodiment of the present disclosure.

FIG. 5 is a schematic cross-sectional view for illustrating a light emitting device in accordance with another exemplary embodiment of the present disclosure.

Referring to FIG. 5, the light emitting device in accordance with the present exemplary embodiment comprises a base 10, light emitting diode chips 20a, 20b, and 20d, and wavelength converters 30a and 30b.

The light emitting diode chips 20a and 20b may be ultraviolet chips, violet chips or blue chips as described above, and the light emitting diode chip 20d, as described in the embodiment of FIG. 2, may be selected from a violet chip, a blue chip, a cyan chip, a green chip, a yellow chip, an amber chip, or a red chip, or any combination thereof.

The wavelength converter 30a and 30b comprise phosphors as described in the embodiment of FIG. 1.

In the present exemplary embodiment, the light emitting diode chip 20a and the wavelength converter 30a constitute a first main light emitting unit, and the light emitting diode chip 20b and the wavelength converter 30b constitute a second main light emitting unit, which implement white respectively. For example, the first light emitting unit may implement cool white, and the second light emitting unit may implement warm white.

In the meantime, an auxiliary light emitting unit including the light emitting diode chip 20d emits light in the wavelength range of violet, blue, cyan, green, yellow, amber, or red.

In the present exemplary embodiment, light corresponding to a spectral power distribution of morning sunlight, afternoon sunlight, or evening sunlight may be roughly implemented by a combination of the first light emitting unit and the second light emitting unit, and a spectral power distribution of sunlight may be precisely controlled by the auxiliary light emitting unit. Therefore, light corresponding to each of the spectral power distributions of morning sunlight, afternoon sunlight, and evening sunlight may be implemented by combining the first light emitting unit, the second light emitting unit and the auxiliary light emitting unit.

Exemplary Embodiment 6

Figure 6:
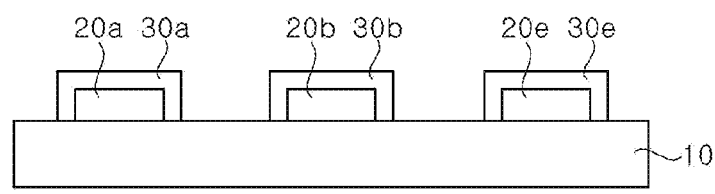
FIG. 6 is a schematic cross-sectional view for illustrating a light emitting device in accordance with another exemplary embodiment of the present invention.

FIG. 6 is a schematic cross-sectional view for illustrating a light emitting device in accordance with another exemplary embodiment of the present disclosure.

Referring to FIG. 6, the light emitting device in accordance with the present exemplary embodiment comprises a first light emitting unit and a second light emitting unit, similarly to the light emitting device described with reference to FIG. 5. However, in the present exemplary embodiment, it is different in that the auxiliary light emitting unit of FIG. 5 is replaced with the auxiliary light emitting unit described in the embodiment of FIG. 3.

That is, the auxiliary light emitting unit comprises a light emitting diode chip 20e and a wavelength converter 30e, the light emitting diode chip 20e is a blue chip, and the wavelength converter 30e comprises at least one of cyan, green, yellow, amber, or red phosphors. As described with reference to FIG. 3, one auxiliary light emitting unit may be used, and a plurality of auxiliary light emitting units may be used.

In the present exemplary embodiment, light corresponding to each of the spectral power distributions of morning sunlight, afternoon sunlight, and evening sunlight is implemented by combining the first light emitting unit, and the second light emitting unit and the auxiliary light emitting unit.

Exemplary Embodiment 7

Figure 7:
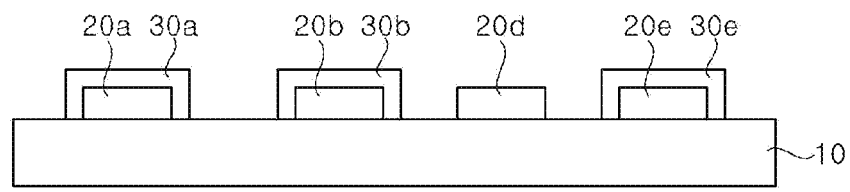
FIG. 7 is a schematic cross-sectional view for illustrating a light emitting device in accordance with another exemplary embodiment of the present disclosure.

FIG. 7 is a schematic cross-sectional view for illustrating a light emitting device in accordance with another exemplary embodiment of the present disclosure.

Referring to FIG. 7, the light emitting device in accordance with the present exemplary embodiment comprises a first light emitting unit, a second light emitting unit and an auxiliary light emitting unit, similarly to the light emitting device described with reference to FIG. 5. In addition, the light emitting device in accordance with the present embodiment further comprises auxiliary light emitting units 20e and 30e described with reference to FIG. 6.

In the present exemplary embodiment, light corresponding to each of the spectral power distributions of morning sunlight, afternoon sunlight, and evening sunlight is implemented by combining the first light emitting unit, the second light emitting unit and two auxiliary light emitting units. Light close to the wavelength distribution of sunlight may be implemented by comprising two kinds of auxiliary light emitting units.

Exemplary Embodiment 8

Figure 8:
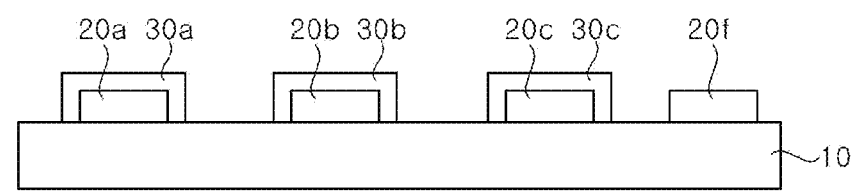
FIG. 8 is a schematic cross-sectional view for illustrating a light emitting device in accordance with another exemplary embodiment of the present disclosure.

FIG. 8 is a schematic cross-sectional view for illustrating a light emitting device in accordance with another exemplary embodiment of the present disclosure.

Referring to FIG. 8, the light emitting device in accordance with the present embodiment is substantially similar to the light emitting diode described with reference to FIG. 1, but is different in that it further comprises an ultraviolet light emitting diode chip 20f.

The ultraviolet light emitting diode chip 20f may emit ultraviolet rays having a wavelength within ranges of 290 to 320 nm, and as a result, it may be irradiated on human skins and vitamin D may be produced.

The ultraviolet light emitting diode chip 20f may also be added to the embodiments of FIGS. 2 to 7.

In the meantime, in the exemplary embodiments described above, the light emitting units may be molded together by the same molding material, or molded respectively by molding materials which are separated from each other.

In order to increase power of the light emitting device, it is necessary to arrange a plurality of light emitting units of the same kind on a base. Hereinafter, embodiments in which a plurality of light emitting units are arranged on a printed circuit board will be described in detail.

Figure 9:
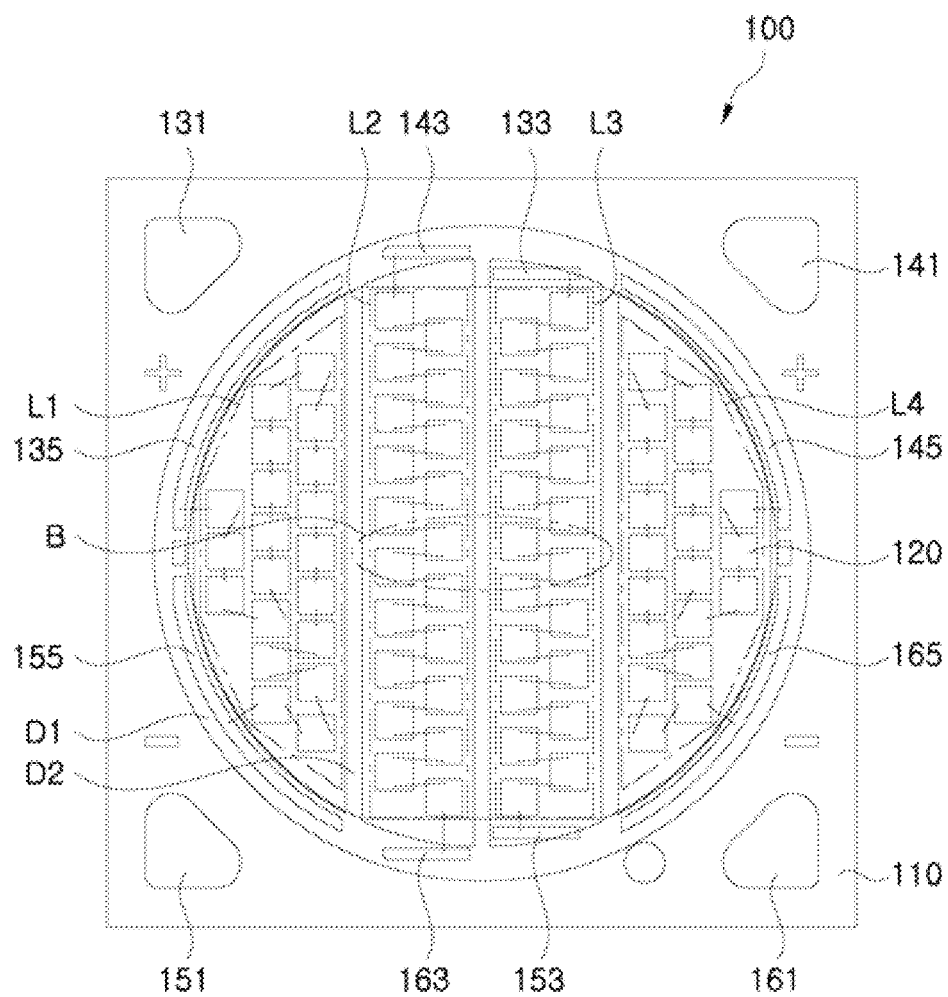
FIG. 9 is a schematic plan view for illustrating a light emitting device in accordance with another exemplary embodiment of the present disclosure.

FIG. 9 is a plan view for illustrating a light emitting device in accordance with another exemplary embodiment of the present disclosure.

Referring to FIG. 9, the light emitting device 100 in accordance with the exemplary embodiment may comprise a base 110, first to fourth light emitting groups L1, L2, L3, and L4, each of which comprises one or more light emitting diode chips 120, first to fourth electrode pads 131, 141, 151, and 161 and first to eighth electrode terminals 133, 135, 143, 145, 153, 155, 163, and 165.

The light emitting diode chips 120 comprised in the light emitting groups L1, L2, L3 and L4 may be mounted on the base 110, such as a printed circuit board, and electric power may be provided to each of the light emitting groups L1, L2, L3, and L4, through the first to fourth electrode pads 131, 141, 151, and 161 and the first to eighth electrode terminals 133, 135, 143, 145, 153, 155, 163, and 165.

Each of the first to fourth light emitting groups L1, L2, L3, and L4 may comprise one or more light emitting diode chips 120. As in the present embodiment, in the case where a plurality of light emitting diode chips 120 are comprised in each of the light emitting groups L1, L2, L3, and L4, the plurality of light emitting diode chips 120 may be electrically connected to one another within the light emitting groups L1, L2, L3, and L4, and the plurality of light emitting diode chips 120 may be connected in a serial connection or a parallel connection.

In the present embodiment, the first to fourth light emitting groups L1, L2, L3, and L4 may independently emit light having a predetermined color temperature, respectively. To do this, light emitting diode chips 120 comprised in each of the light emitting groups L1, L2, L3, and L4 may be light emitting diode chips 120 having the same peak wavelength. However, the present disclosure is not limited thereto, and it is possible to have light emitting diode chips 120 that emit light having different peak wavelengths within a predetermined range.

In the meantime, the first to fourth light emitting groups L1, L2, L3, and L4 may emit light having different color temperatures one another. For example, two or more light emitting groups may emit light having the same color temperature, and remaining light emitting groups may emit light having other color temperature.

As an example, in the present embodiment, the first light emitting group L1 and the third light emitting group L3 may emit light having the same color temperature, and the second light emitting group L2 and the fourth light emitting group L4 may emit light having the same color temperature. At this time, the color temperature of the light emitted from the first and third light emitting groups L1 and L3 and the color temperature of the light emitted from the second and fourth light emitting groups L2 and L4 may be different.

The first to fourth light emitting groups L1, L2, L3, and L4 may comprise a wavelength converter comprising a phosphor as needed. The light emitting diode chips 120 comprised in the same light emitting group of the first to fourth light emitting groups L1, L2, L3, and L4 may be used to implement light emitting sources implementing the same spectral power distribution or may be used to implement light emitting sources implementing different spectral power distributions. At this time, a wavelength converter may be arranged on the light emitting diode chip 120, and a predetermined spectral power distribution may be shown. The wavelength converters may be independently disposed on the respective light emitting diode chips 120, but it is not limited thereto, and the wavelength converters may be disposed to cover the respective light emitting groups L1, L2, L3, and L4. By combining the light emitting diode chip 120 and the wavelength converter, the main light emitting unit and/or auxiliary light emitting unit described in the previous embodiments 1 to 8 may be formed. For example, light emitting diode chips 120 comprised in each of the light emitting groups L1, L2, L3, and L4 may implement main light emitting units or auxiliary light emitting units together with a wavelength converter, thus, the light emitting device 100 may change spectral power distributions of light corresponding to power of sunlight and in accordance with changes in spectral power distributions of sunlight.

Furthermore, the light emitting diode chips 120 comprised in each of light emitting groups L1, L2, L3, and L4 may emit light having different wavelengths, for example, a blue light emitting diode chip, a green light emitting diode chip, and a red light emitting diode chip may be used in one light emitting group, and light emitted from each light emitting diode chip 120 may be mixed and emit white light. As another example, the main light emitting unit and the auxiliary light emitting unit may be comprised in each light emitting group.

And the plurality of light emitting diode chips 120 comprised in each of the light emitting groups L1, L2, L3, and L4 serve as light emitting sources, respectively. The plurality of light emitting diode chips 120 may be alternately arranged on the bases 110. Alternatively in the case when blue light emitting diode chips, green light emitting diode chips, and red light emitting diode chips are used, they may be arranged concentrically adjacent to each other or triangularly arranged.

In the present embodiment, it is described that 20 light emitting diode chips 120 are comprised in each of the first to fourth light emitting groups L1, L2, L3, and L4, and it is described and illustrated that the first to fourth light emitting groups L1, L2, L3, and L4 are disposed in a circular mounting portion on the base 110. As an example, 20 light emitting diode chips 120 comprised in the first light emitting group L1 may be arranged in three lines, and a plurality of light emitting diode chips 120 in each line may be arranged at predetermined distances. At this time, a light emitting diode chip 120 arranged in each line may not be arranged to be flush with a light emitting diode chip 120 of an adjacent line thereto, but may be arranged in a position shifted upward or downward. For example, the light emitting diode chips 120 arranged in each line may be arranged at the same distance from one another, and the light emitting diode chip 120 arranged in one line may be arranged to be flush with a center between two light emitting diode chips 120 of an adjacent line thereto. Accordingly, the first light emitting group L1 may be configured in three lines comprising three light emitting diode chips 120, eight light emitting diode chips 120 and nine light emitting diode chips 120, respectively, and the light emitting diode chips 120 of the respective lines may be arranged alternately with one another. As a result, light emitting units of a same kind may be arranged to be spaced apart at a distance and not to be adjacent to one another, and may implement uniform light.

In addition, 20 light emitting diode chips 120 comprised in the second light emitting group L2 may be arranged in two lines, and 10 light emitting diode chips 120 may be arranged in each line at a predetermined distance. At this time, the light emitting diode chips 120 arranged in each line may not be arranged to be flush with a light emitting diode chip 120 of an adjacent line thereto, but may be arranged in a position shifted upward or downward. For example, the light emitting diode chips 120 arranged in each line may be arranged at the same distance from one another, and the light emitting diode chip 120 arranged in one line may be arranged to be flush with a center between two light emitting diode chips 120 of an adjacent line thereto.

In the third light emitting group L3, like the second light emitting group L2, 20 light emitting diode chips 120 may be arranged in two lines, and the light emitting diode chips 120 arranged in each line may not be arranged to be flush with a light emitting diode chip 120 of an adjacent line thereto, but may be arranged in a position shifted upward or downward. For example, the light emitting diode chips 120 arranged in each line may be arranged at the same distance from one another, and the light emitting diode chip 120 arranged in one line may be arranged to be flush with a center between two light emitting diode chips 120 of an adjacent line thereto.

The fourth light emitting group L4, similarly to the first light emitting group L1, may have 20 light emitting diode chips 120 arranged in three lines.

As described above, when the light emitting diode chips 120 are connected in series, the length of a wire W connecting each light emitting diode chip 120 may be minimized by arranging the plurality of light emitting diode chips 120 comprised in each of light emitting groups L1, L2, L3, and L4 at shifted positions. Further, as described above, even if the number of the light emitting diode chips 120 comprised in the light emitting device 100 is reduced, a desired color temperature may be implemented by arranging the plurality of light emitting diode chips 120.

In the case when two or more kinds of light emitting units are comprised in one light emitting group, it is possible to mix light emitted from the light emitting units more uniformly by alternately arranging these light emitting units, and a size of the light emitting device may be reduced. For example, when arranging blue, green, and red light emitting diode chips in each light emitting group L1, L2, L3, and L4, blue, green, and red light emitting diode chips may be arranged at apexes of a triangular structure. Further, another triangular structure adjacent to the triangular structure composed of blue, green, and red light emitting diode chips, as shown in FIG. 1, may be arranged in an inverted triangular shape, and light emitting diode chips of the same kind may be arranged so as to be spaced farther apart than different kinds of chips. In particular, pairs of light emitting diode chips of the same kind may be spaced apart from one another by the same distance. As a result, the light emitting diode chips 120 may be arranged in a densely packed state, and uniform light may be implemented. Blue, green, and red light emitting diode chips are described as examples, but it is not limited thereto, and three kinds of main light emitting units, or two kinds of main light emitting units and one auxiliary light emitting unit, or one main light emitting unit and two kinds of auxiliary light emitting units may be arranged as described above.

As shown in FIG. 9, the first to fourth electrode pads 131, 141, 151, and 161 are disposed at the four corners of the base 110, respectively, and are incorporated to electrically connect to an external power supply. To do this, the first to fourth electrode pads 131, 141, 151, and 161 may be formed to have predetermined widths.

The first to eighth electrode terminals 133, 135, 143, 145, 153, 155, 163, and 165 may be incorporated to electrically connect to the first to fourth light emitting groups L1, L2, L3, and L4, respectively, the first to eighth electrode terminals 133, 135, 143, 145, 153, 155, 163, and 165 may be formed in a shape surrounding the first to fourth light emitting groups L1, L2, L3, and L4 in the present embodiment.

Referring to FIG. 9, the first light emitting group L1 is electrically connected to the second electrode terminal 135 and the sixth electrode terminal 155, and the second light emitting group L2 is electrically connected to the third electrode terminal 143 and the seventh electrode terminal 163. The third light emitting group L3 is electrically connected to the first electrode terminal 133 and the fifth electrode terminal 153, and the fourth light emitting group L4 is electrically connected to the fourth electrode terminal 145 and the eighth electrode terminal 165.

In the present embodiment, the first to fourth electrode terminals 133, 135, 143, and 145 may be terminals for supplying power to the first to fourth light emitting groups L1, L2, L3, and L4, and the fifth to eighth electrode terminals 153, 155, 163, and 165 may be ground terminals. And the first electrode pad 131 and the second electrode pad 141 may be terminals for supplying power to the first to fourth light emitting groups L1, L2, L3, and L4, and the third electrode pad 151 and the fourth electrode pad 161 may be ground terminals. However, it is not limited thereto, and a type of each electrode terminal and electrode pad may be changed as required.

In addition, if necessary, a blue light emitting diode chip, a green light emitting diode chip and a red light emitting diode chip may be electrically connected to electrode pads in a state of being connected to a common terminal, and light emitting groups having different color temperatures of the first to fourth light emitting groups L1, L2, L3, and L4 may be also connected to a common terminal as in the present embodiment.

Further, although it will be described in detail later, a reflector D1 may be disposed to surround the first to fourth light emitting groups L1, L2, L3, and L4, and a partition wall D2 may be disposed among the first to fourth light emitting groups L1, L2, L3, and L4. The reflector D1 may define a light emitting surface of the light emitting device 100 by being disposed so as to surround the first to fourth light emitting groups L1, L2, L3, and L4, and may define an area for forming a molding portion Ph on the light emitting surface defined inside the reflector D1. The reflector D1 may reflect light emitted from the first to fourth light emitting groups L1, L2, L3, and L4 to improve a light emission efficiency of the light emitting device 100.

And, the partition wall D2 is disposed among the first to fourth light emitting groups L1, L2, L3, and L4, and incorporated to prevent light emitted from each light emitting group L1, L2, L3 and L4 from being mixed with light emitted from the adjacent light emitting groups L1, L2, L3, and L4.

Figure 10:
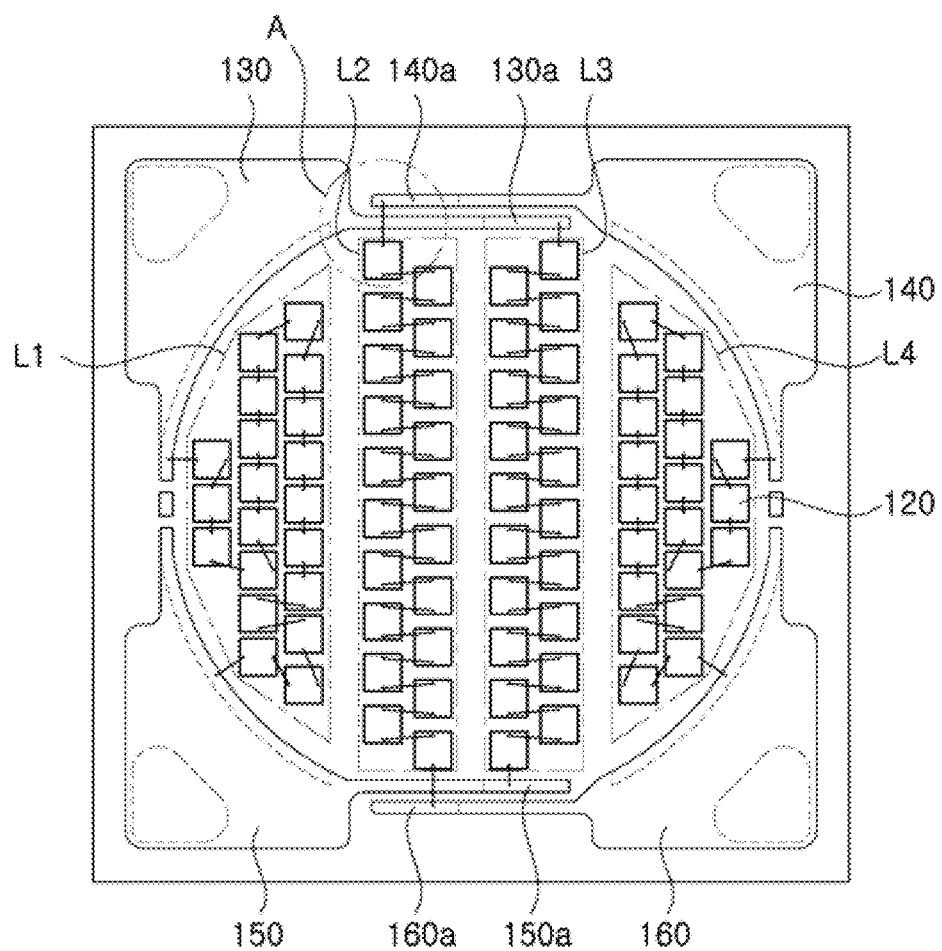
FIG. 10 is a view for illustrating electrical connections between light emitting groups and electrodes of the light emitting device in accordance with the embodiment of FIG. 9.
Figure 11:
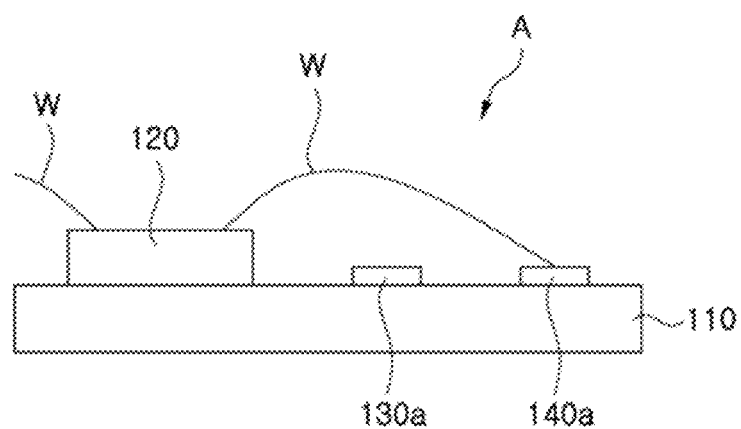
FIG. 11 is a schematic cross-sectional view of section A of FIG. 10.

FIG. 10 is a view for illustrating electrical connections between light emitting groups and electrodes of the light emitting device in accordance with the present embodiment, and FIG. 11 is a cross-sectional view of section A of FIG. 10.

With reference to FIGS. 10 and 11, electrical connections between light emitting groups and the electrodes of the light emitting device 100 in accordance with the present embodiment and a relationship between electrode pads and electrode terminals will be described.

FIG. 10 is a view in which an insulating layer (not shown) covering the electrodes is removed from the base 110 in the light emitting device 100 of FIG. 9, and electrode shapes forming the electrode pads and the electrode terminals are displayed as the insulating layer is removed. And in FIG. 10, positions where each electrode pad and electrode terminal are arranged are indicated by dotted lines.

Referring to FIG. 10, a first electrode pad 131, a first electrode terminal 133 and a second electrode terminal 135 are formed as the insulating layer is formed on a first electrode 130, and a second electrode pad 141, a third electrode terminal 143 and a fourth electrode terminal 145 are formed as the insulating layer is formed on a second electrode 140. A third electrode pad 151, a fifth electrode terminal 153 and a sixth electrode terminal 155 are formed as the insulating layer is formed on a third electrode 150, and a fourth electrode pad 161, a seventh electrode terminal 163 and an eighth electrode terminal 165 are formed as the insulating layer is formed on a fourth electrode 160.

In addition, the first to fourth electrodes 130, 140, 150, and 160 may be formed with first to fourth electrode extensions 130*a*, 140*a*, 150*a*, and 160*a* on their sides, respectively. The first electrode extension 130*a* is formed extending from the first electrode 130 toward the second electrode 140, and the second electrode extension 140*a* is formed extending from the second electrode 140 toward the first electrode 130. At this time, the first electrode extension 130*a* and the second electrode extension 140*a* may have a region arranged so as to be adjacent to each other, but may be spaced apart so as to be electrically insulated from each other. In addition, the second electrode extension 140*a* may be arranged outside of the first electrode extension 130*a* relative to a position where the light emitting groups L1, L2, L3, and L4 are arranged.

The third electrode extension 150*a* is formed extending from the third electrode 150 toward the fourth electrode 160, and the forth electrode extension 160*a* is formed extending from the fourth electrode 160 toward the third electrode 150. At this time, the third electrode extension 150*a* and the fourth electrode extension 160*a* may have a region arranged so as to be adjacent to each other, but may be spaced apart so as to be electrically insulated from each other. In addition, the fourth electrode extension 160*a* may be arranged outside of the third electrode extension 150*a* relative to a position where the light emitting groups L1, L2, L3, and L4 are arranged.

As described above, in a state where the first to fourth electrodes 130, 140, 150, and 160 are formed, the first light emitting group L1 is electrically connected to the first electrode 130 and the third electrode 150, and the second light emitting group L2 is electrically connected to the second electrode 140 and the fourth electrode 160. And the third light emitting group L3 is electrically connected to the first electrode 130 and the third electrode 150, and the fourth light emitting group L4 is electrically connected to the second electrode 140 and the fourth electrode portion 160.

Accordingly, in the present embodiment, the first light emitting group L1 and the third light emitting group L3 may be simultaneously controlled and driven, and the second light emitting group L2 and the fourth light emitting group L4 may be simultaneously controlled and driven, but it is not limited thereto, and positions of simultaneously driven light emitting groups L1, L2, L3, and L4 may be changed.

For example, the first light emitting group L1 and the third light emitting group L3 may be configured to emit light at a color temperature of 1800 K, the second light emitting group L2 and the fourth light emitting group L4 may be configured to emit light at a color temperature of 4000 K. As a result, light emitted from each light emitting group L1, L2, L3, and L4 may be mixed to emit light having a color temperature of about 3000 K based on operation of each light emitting group L1, L2, L3, and L4, and it is possible to change the light mixed in an adjustment of a light emitting power or the like of each light emitting group L1, L2, L3, and L4.

In addition, as another example, one of the four light emitting groups L1, L2, L3, and L4 may be configured to emit light at a color temperature of 1800 K, another one to emit light at a color temperature of 4000 K, and the other one to emit light at a color temperature of 6500 K. At this time, the number light emitting groups to emit light at a color temperature of 4000 K may be two. As described above, various color temperatures may be implemented according to driving conditions by adjusting color temperatures of light emission in each light emitting group L1, L2, L3, and L4.

In the case that the light emitting device 100 emits light with those three color temperatures, desired mixed light may be emitted by arranging the four light emitting groups L1, L2, L3, and L4 having color temperatures of 4000K, 1800K, 6500K and 4000K, respectively, in this sequence. At this time, when the four light emitting groups L1, L2, L3, and L4 have color temperatures of 4000K, 1800K, 6500K, and 4000K, respectively, the four light emitting groups L1, L2, L3, and L4 may be disposed in parallel to one another in this sequence.

Further, in the case when the four light emitting groups L1, L2, L3, and L4 have color temperatures of 4000 K, 1800 K, 6500 K, and 4000 K respectively, two light emitting groups having a color temperature of 4000 K may be arranged diagonally, and a light emitting group having a color temperature of 1800 K and a light emitting group having a color temperature of 6000 K may be arranged diagonally. In this way, four light emitting groups may be arranged in a square shape.

And, if necessary, in the case of emitting light of three color temperatures, for example, three light emitting groups having color temperatures of 1800 K, 4000 K, and 6500 K may be arranged on a light emitting surface of a light emitting device in a triangular arrangement to emit desired mixed color light. Further, if necessary, three light emitting groups may be arranged in a circle to be adjacent to one another.

And, a driving condition of each light emitting group L1, L2, L3, and L4 may be changed by changing electrical connections between each light emitting group L1, L2, L3, and L4 and each electrode.

Referring again to FIG. 10, the second light emitting group L2 is electrically connected to the second electrode extension 140*a* of the second electrode 140 and a fourth electrode extension 160*a* of the fourth electrode 160, and the third light emitting group L3 is electrically connected to the third electrode extension 130*a* of the first electrode 130 and the first electrode extension 150*a* of the third electrode 150.

Here, the first electrode extension 130*a* and the third electrode extension 150*a* may be disposed adjacent to the third light emitting group L3 to be directly electrically connected through a wire W. In the meantime, the second electrode extension 140*a* and the fourth electrode extension 160*a* are not disposed to be adjacent to the second light emitting group L2, but the first electrode extension 130*a* and the third electrode extension 150*a* are disposed in between, respectively.

Accordingly, a wire W electrically connecting the second light emitting group L2 and the second electrode extension 140*a* may electrically connect the second light emitting group L2 and the second electrode extension 140*a* by passing through an upper region of the first electrode extension 130*a*. Similarly, a wire W electrically connecting the second light emitting group L2 and the fourth electrode extension 160*a* may electrically connect the second light emitting group L2 and the fourth electrode extension 160*a* by passing through an upper region of the third electrode extension 150*a*.

Referring to FIG. 11, to electrically connect the light emitting diode chip 120 comprised in the second light emitting group L2 and the second electrode extension 140*a*, the wire W passes through the upper region of the first electrode extension 130*a* in a state where it is spaced apart from the first electrode extension 130*a* by a certain distance or more. In the present embodiment, it is described that the first electrode extension 130*a* and the second electrode extension 140*a* may have the same electrical polarity, but it is not limited thereto, the electrode extension 130*a* and second electrode extension 140a may have different electrical polarities from each other.

Likewise, the wire W may also electrically connect the light emitting diode chip 120 comprised in the second light emitting group L2 and the fourth electrode extension 160a, as described above, by passing through the upper region of the third electrode extension 150a.

Figure 12:
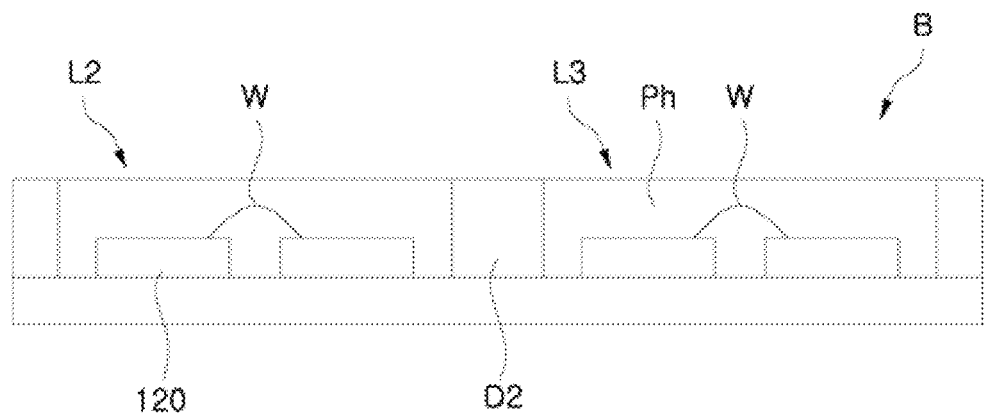
FIG. 12 is a schematic cross-sectional view of section B of FIG. 9.

FIG. 12 is a cross-sectional view of section B of FIG. 9.

FIG. 12 is a view for illustrating a partition wall D2 to be formed between the second light emitting group L2 and the third light emitting group L3. As shown in FIG. 12, the partition wall D2 may be formed between the second and third light emitting groups L2 and L3. The partition wall D2 may be formed to be higher than heights of the light emitting diode chips 120 comprised in each of the light emitting groups L1, L2, L3, and L4. The partition wall D2 may block light emitted from each light emitting group L1, L2, L3 and L4 from being emitted to adjacent light emitting groups L1, L2, L3 and L4. Thus, the light emitting groups L1, L2, L3 and L4 can emit light having their own color temperatures to the outside, respectively, since light emitted from any one of the light emitting groups L1, L2, L3, and L4 is blocked from entering neighboring light emitting groups L1, L2, L3, and L4.

In the meantime, as shown in FIG. 12, a molding portion Ph may be formed to cover each of the light emitting groups L1, L2, L3, and L4. The molding portion Ph may be made of a material transmitting light, such as a transparent resin, and may contain one or more kinds of phosphors as required.

Figure 13:
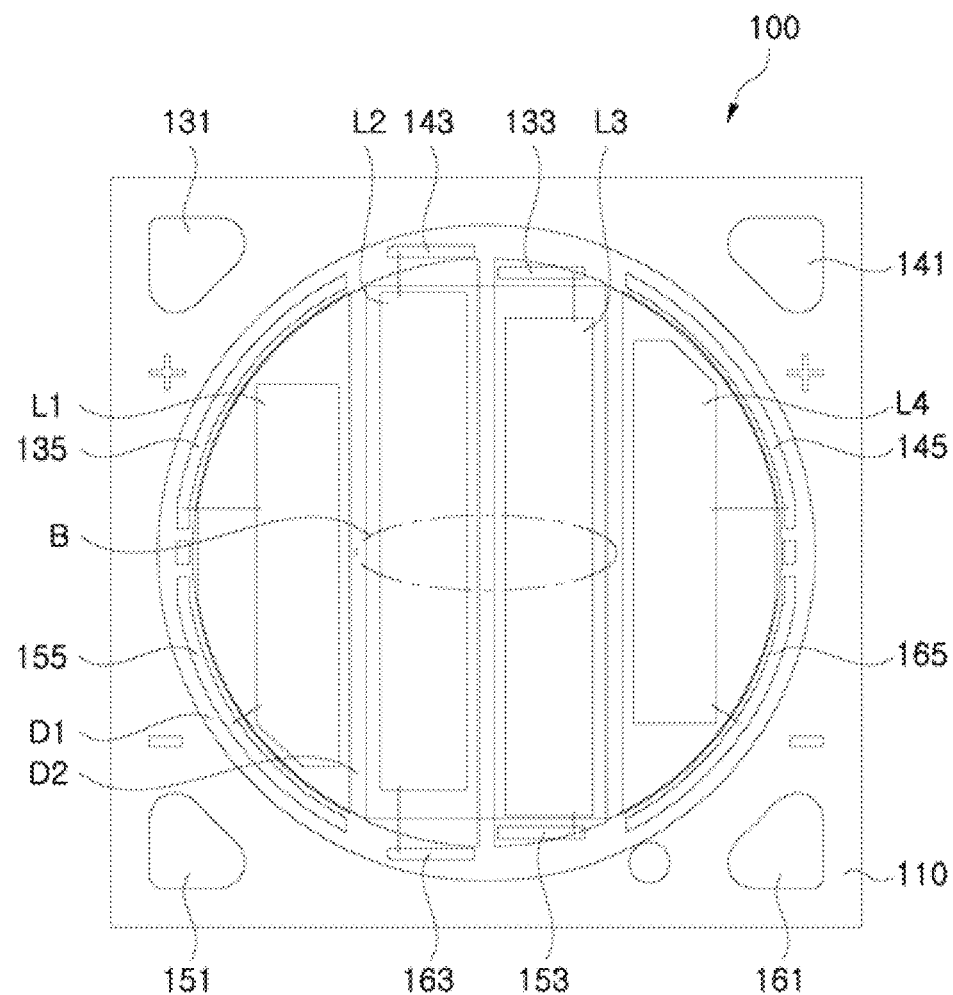
FIG. 13 is a schematic plan view for illustrating a light emitting device in accordance with another exemplary embodiment of the present disclosure.

FIG. 13 is a schematic plan view for illustrating a light emitting device in accordance with another exemplary embodiment of the present disclosure.

Figure 15:
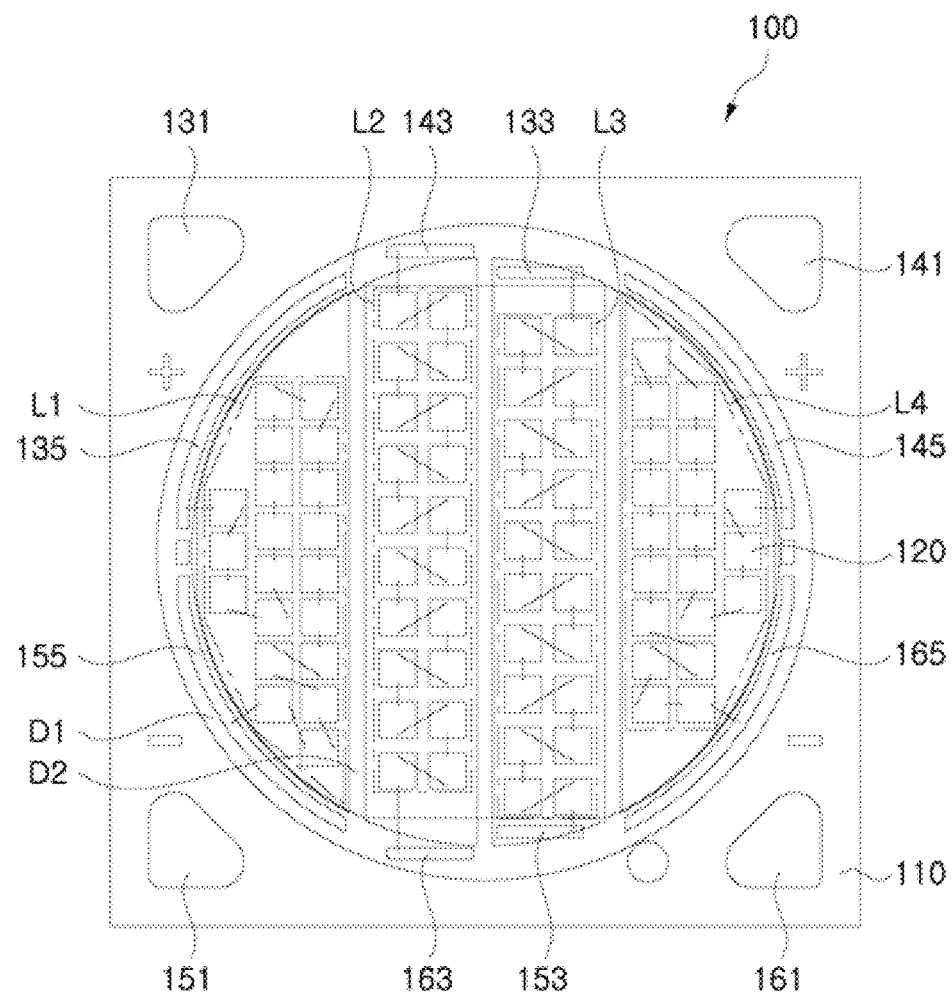
FIG. 15 is a schematic plan view for illustrating an example in which a plurality of light emitting diode chips are arranged in each light emitting group of the light emitting device of FIG. 13.

Referring to FIG. 13, the light emitting device 100 in accordance with the exemplary embodiment, similar to the light emitting device of FIG. 9, may comprise a base 110, first to fourth light emitting groups L1, L2, L3, and L4 comprising one or more light emitting diode chips 120 shown in FIG. 15, first to fourth electrode pads 131, 141, 151, and 161 and first to eighth electrode terminals 133, 135, 143, 145, 153, 155, 163, and 165.

Since the light emitting device 100 according to the present embodiment is similar to the light emitting device described with reference to FIG. 9, descriptions of the same content will be omitted and differences will be described below in detail in order to avoid redundant description.

The first to fourth light emitting groups L1, L2, L3, and L4 may be disposed in a circular mounting portion on the base 110. The light emitting groups L1, L2, L3, and L4, as shown in FIG. 13, may be disposed in lines in parallel to one another, respectively, and each light emitting group L1, L2, L3, and L4 may be disposed alternately with one another. That is, centers of each light emitting group L1, L2, L3, and L4 are not disposed to be flush with one another, but disposed alternately with one another.

As an example, the first light emitting group L1 may be disposed at a leftmost side of the circular mounting portion on the base 110, and may be disposed adjacent to one side of the base 110. And the fourth light emitting group L4 may be disposed on a rightmost side of the circular mounting portion on the base 100, and may be disposed adjacent to another side of the base 110 opposite the one side. In addition, the second light emitting group L2 and the third light emitting group L3 may be disposed between the first light emitting group L1 and the fourth light emitting group L4, respectively, and the second light emitting group L2 may be disposed adjacent to the first light emitting group L1, and the third light emitting group L3 may be disposed adjacent to the fourth light emitting group L4. However, it is not limited thereto, if necessary, positions where the light emitting groups L1, L2, L3, and L4 are alternately disposed may be changed in various ways as required.

Figure 14:
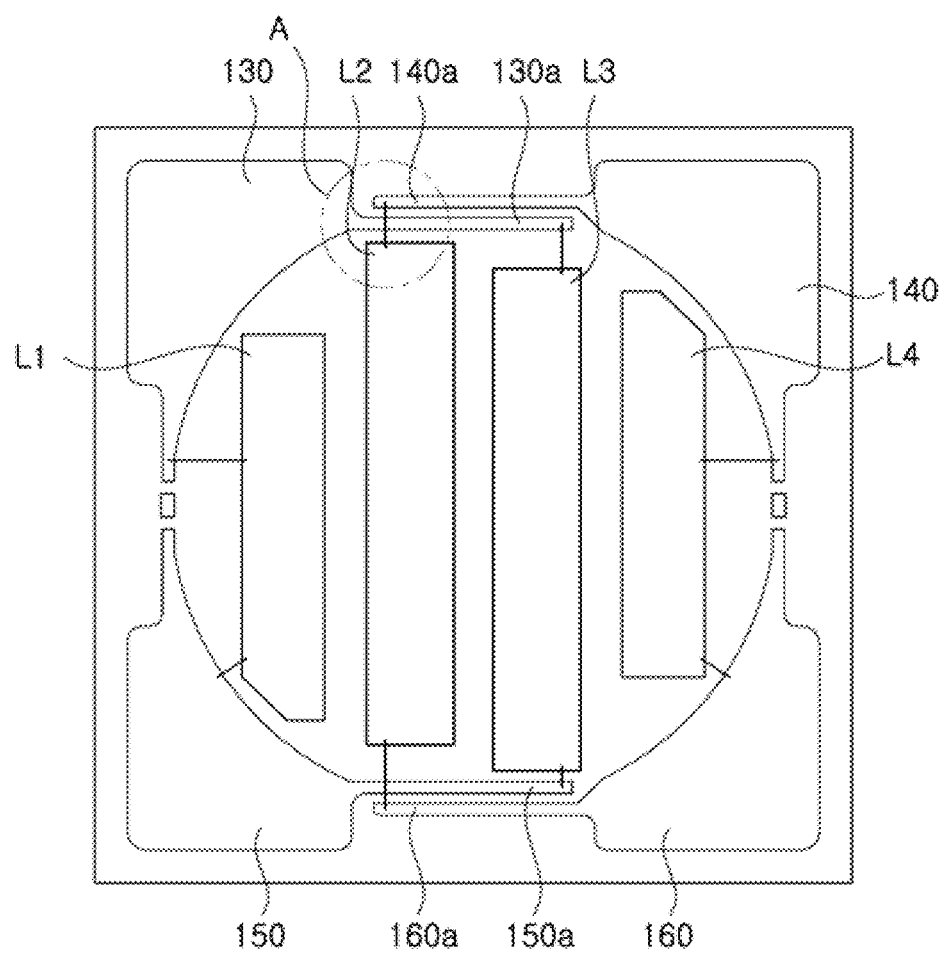
FIG. 14 is a schematic plan view for illustrating electrical connections between light emitting groups and electrodes of the light emitting device of FIG. 13.

FIG. 14 is a view for illustrating electrical connections between light emitting groups and electrodes in accordance with one exemplary embodiment of the present disclosure. In the meantime, the cross section of section A of FIG. 14 is the same as that shown in FIG. 11, and the section of section B of FIG. 14 is the same as that shown in FIG. 12.

Electrical connections between light emitting groups and the electrodes of the light emitting device 100 in accordance with the present embodiment are generally similar to those between light emitting groups and the electrodes of the light emitting device described with reference to FIGS. 10 and 11, and further, since a configuration of a partition wall D2 of the light emitting device 100 is similar to that described with reference to FIG. 12, descriptions of the same content will be omitted and differences will be described below in detail in order to avoid redundant description.

Since the centers of each light emitting group L1, L2, L3, and L4 are disposed to be flush with one another in the embodiment of FIG. 10, a length of the wire connecting the second light emitting group L2 and the second electrode extension 140a is different from that of the wire connecting the third light emitting group L3 and the first electrode extension 130a. In contrast, in this embodiment, lengths of wires may be adjusted by arranging the light emitting groups L1, L2, L3, and L4 alternately.

FIG. 15 is a view for illustrating an example in which a plurality of light emitting diode chips are arranged in each light emitting group of the light emitting device of FIG. 13.

Referring to FIG. 15, as an example, 20 light emitting diode chips 120 comprised in the first light emitting group L1 may be arranged in three lines, and a plurality of light emitting diode chips 120 may be arranged in each line at a predetermined distance. At this time, the light emitting diode chips 120 arranged in each line may be arranged to be flush with a light emitting diode chip 120 of an adjacent line thereto. Accordingly, the first light emitting group L1 may be configured with three lines comprising three light emitting diode chips 120, eight light emitting diode chips 120 and nine light emitting diode chips 120, respectively, and the light emitting diode chips 120 of the respective lines may be arranged to be flush with one another. At this time, the first light emitting group L1 may be biased toward one side of the base 110.

In addition, 20 light emitting diode chips 120 comprised in the second light emitting group L2 may be arranged in two lines, and 10 light emitting diode chips 120 may be arranged in each line at a predetermined distance. At this time, the light emitting diode chips 120 arranged in each line may be arranged to be flush with a light emitting diode chip 120 of an adjacent line thereto. At this time, the second light emitting group L2 may be arranged to be adjacent to and in parallel with the first light emitting group L1.

In the third light emitting group L3, like the second light emitting group L2, 20 light emitting diode chips 120 may be arranged in two lines, and the light emitting diode chips 120 arranged in each line may be arranged to be flush with a light emitting diode chip 120 of an adjacent line thereto. At this time, the third light emitting group L3 may be arranged in an adjacent position alternately with the second light emitting group L2.

The fourth light emitting group L4, similarly to the first light emitting group L1, may have 20 light emitting diode chips 120 arranged in three lines, and the light emitting diode chips 120 arranged in each line may be arranged to be flush with a light emitting diode chip 120 of an adjacent line thereto. At this time, the fourth light emitting group L4 may be arranged in an adjacent position alternately with the third light emitting group L3.

Furthermore, the light emitting devices in accordance with the exemplary embodiments of the present disclosure may be used for various lighting devices such as light bulbs and tube lighting devices.

Although the various exemplary embodiments of the present disclosure have been described above, the present disclosure is not limited to these embodiments, and various modifications can be made. In addition, the elements described in the particular embodiments can be applied to other embodiments without departing from the technical spirit according to the appended claims of the present disclosure.

What is claimed is:

1. A light emitting device, comprising:
a base;
a first light emitting group, a second light emitting group, a third light emitting group, and a fourth light emitting group disposed on the base and configured to be supplied with power from an external power source; and
a first conductor, a second conductor, a third conductor, and a fourth conductor disposed on the base and electrically connected to the external power source, wherein:
each of the first, second, third, and fourth light emitting groups comprises a plurality of light emitters;
the first light emitting group is configured to emit light having a color temperature different from that emitted from the second light emitting group, and the third light emitting group is configured to emit light having a color temperature different from that emitted from the fourth light emitting group;
each of the first and third light emitting groups is electrically connected to the first and third conductors;
each of the second and fourth light emitting groups is electrically connected to the second and fourth conductors;
the first conductor includes a first extension region extending toward the second conductor, and the second conductor includes a second extension region extending toward the first conductor;
the first and second extension regions comprise a region overlapping each other;
a first region of the first conductor from which the first extension region extends includes a first surface that is slanted with respect to a direction in which the first extension region extends, and the first surface is disposed on the base at a location preceding a beginning portion of the first extension region; and
a second region of the second conductor from which the second extension region extends includes a second surface that is slanted with respect to a direction in which the second extension region extends, and the second surface is disposed on the base at a location preceding a beginning portion of the second extension region.

2. The light emitting device of claim 1, wherein the second extension region comprises a region disposed outside of the first extension region.

3. The light emitting device of claim 2, wherein the region of the second extension region is arranged outside of the first extension region relative to a position where the first, the second, the third, and the fourth light emitting groups are arranged.

4. The light emitting device of claim 1, wherein the third conductor includes a third extension region extending toward the fourth conductor, and the fourth conductor includes a fourth extension region extending toward the third conductor.

5. The light emitting device of claim 4, wherein the third and fourth extension regions comprise a region overlapping each other.

6. The light emitting device of claim 4, wherein the fourth extension region comprises a region disposed outside of the third extension region.

7. The light emitting device of claim 6, wherein the region of the fourth extension region is arranged outside of the third extension region relative to a position where the first, the second, the third, and the fourth light emitting groups are arranged.

8. A light emitting device comprising:
a base;
a first light emitting group, a second light emitting group, a third light emitting group, and a fourth light emitting group disposed on the base and configured to be supplied with power from an external power source; and
a first conductor, a second conductor, a third conductor, and a fourth conductor disposed on the base and electrically connected to the external power source, wherein:
each of the first, second, third, and fourth light emitting groups comprises a plurality of light emitters;
the first light emitting group is configured to emit light having a color temperature different from that emitted from the second light emitting group, and the third light emitting group is configured to emit light having a color temperature different from that emitted from the fourth light emitting group;
each of the first and third light emitting group is electrically connected to the first and third conductors;
each of the second and fourth light emitting groups is electrically connected to the second and fourth conductors;
the first conductor includes a first extension region extending toward the second conductor, and the second conductor includes a second extension region extending toward the first conductor;
the second extension region comprises a region disposed outside of the first extension region;
a first region of the first conductor from which the first extension region extends includes a first surface that is slanted with respect to a direction in which the first exten sion region extends, and the first surface is disposed on the base at a location preceding a beginning portion of the first extension region; and
a second region of the second conductor from which the second extension region extends includes a second surface that is slanted with respect to a direction in which the second extension region extends, and the second surface is disposed on the base at a location preceding a beginning portion of the second extension region.

9. The light emitting device of claim 8, wherein the region of the second extension region is arranged outside of the first extension region relative to a position where the first, the second, the third, and the fourth light emitting groups are arranged.

10. The light emitting device of claim 8, wherein the third conductor includes a third extension region extending toward the fourth conductor, and the fourth conductor includes a fourth extension region extending toward the third conductor.

11. The light emitting device of claim 10, wherein the third and fourth extension regions comprise a region overlapping each other.

12. The light emitting device of claim 10, wherein the fourth extension region comprises a region disposed outside of the third extension region.

13. The light emitting device of claim 12, wherein the region of the fourth extension region is arranged outside of the third extension region relative to a position where the first, the second, the third, and the fourth light emitting groups are arranged.

14. The light emitting device of claim 8, wherein the first light emitting group is configured to emit light having a color temperature different from that emitted from the third light emitting group.

15. A light emitting device comprising:
a base;
a first light emitting group, a second light emitting group, a third light emitting group, and a fourth light emitting group disposed on the base and configured to be supplied with power from an external power source; and
a first conductor, a second conductor, a third conductor, and a fourth conductor disposed on the base and electrically connected to the external power source, wherein:
each of the first, second, third, and fourth light emitting groups comprises at least one light emitting diode and a wavelength converter;
the first light emitting group is configured to emit light having a color temperature different from that emitted from the second light emitting group, and the third light emitting group is configured to emit light having a color temperature different from that emitted from the fourth light emitting group;
each of the first and third light emitting group is electrically connected to the first and third conductors;
each of the second and fourth light emitting groups is electrically connected to the second and fourth conductors;
the first conductor includes a first extension region extending toward the second conductor, and the second conductor includes a second extension region extending toward the first conductor;
the first and second extensions comprise a region overlapping each other;
a first region of the first conductor from which the first extension region extends includes a first surface that is slanted with respect to a direction in which the first extension region extends, and the first surface is disposed on the base at a location preceding a beginning portion of the first extension region; and
a second region of the second conductor from which the second extension region extends includes a second surface that is slanted with respect to a direction in which the second extension region extends, and the second surface is disposed on the base at a location preceding a beginning portion of the second extension region.

16. The light emitting device of claim 15, wherein the second extension region
comprises a region disposed outside of the first extension region.

17. The light emitting device of claim 16, wherein the region of the second extension region is arranged outside of the first extension region relative to a position where the first, the second, the third, and the fourth light emitting groups are arranged.

18. The light emitting device of claim 15, wherein the third conductor includes a third extension region extending toward the fourth conductor, and the fourth conductor includes a fourth extension region extending toward the third conductor.

19. The light emitting device of claim 18, wherein the third and fourth extension regions comprise a region overlapping each other.

20. The light emitting device of claim 18, wherein the fourth extension region comprises a region disposed outside of the third extension region.

* * * * *